(12) United States Patent
Matsuno

(10) Patent No.: US 6,600,172 B1
(45) Date of Patent: Jul. 29, 2003

(54) IMAGE SENSOR AND METHOD OF FABRICATING THE SAME

(75) Inventor: Fumihiko Matsuno, Tokyo (JP)

(73) Assignee: NEC Corporation, Tokyo (JP)

( * ) Notice: Subject to any disclaimer, the term of this patent is extended or adjusted under 35 U.S.C. 154(b) by 21 days.

(21) Appl. No.: 09/718,603

(22) Filed: Nov. 22, 2000

(30) Foreign Application Priority Data

Nov. 26, 1999 (JP) ............................................. 11-336385

(51) Int. Cl.⁷ .............................................. H01L 29/04
(52) U.S. Cl. .......................................... 257/59; 257/72
(58) Field of Search ............................. 257/66, 72, 57, 257/59, 89, 61, 290, 291, 29.282; 438/149, 80, 164

(56) References Cited

U.S. PATENT DOCUMENTS

| | | | |
|---|---|---|---|
| 4,651,001 A | * | 3/1987 | Harada et al. .............. 250/330 |
| 5,605,847 A | * | 2/1997 | Zhang ........................ 438/164 |
| 6,184,945 B1 | * | 2/2001 | Sung ........................... 349/38 |
| 6,211,553 B1 | * | 4/2001 | Sung ........................... 257/336 |
| 6,335,770 B1 | * | 1/2002 | Komatsu ..................... 349/141 |
| 6,342,935 B1 | * | 1/2002 | Jang et al. .................. 349/113 |
| 6,344,885 B1 | * | 2/2002 | Mori et al. .................. 345/93 |

FOREIGN PATENT DOCUMENTS

| | | |
|---|---|---|
| JP | 59-110179 | 6/1984 |
| JP | 62-204570 | 9/1987 |
| JP | 64-080072 | 3/1989 |
| JP | 04-180264 | 6/1992 |
| JP | 07248507 A | * 9/1995 ........... G02F/1/136 |
| JP | 08-064795 | 3/1996 |

* cited by examiner

*Primary Examiner*—Olik Chaudhuri
*Assistant Examiner*—Brook Kebede
(74) *Attorney, Agent, or Firm*—Scully, Scott, Murphy & Presser

(57) ABSTRACT

An image sensor is provided, which prevents effectively the break or disconnection of transparent electrodes of photodiodes and which enhances its sensitivity. This sensor is comprised of (a) a transparent substrate; (b) a first dielectric layer formed over the substrate; (c) lower electrodes arranged at intervals on the first dielectric layer; (d) a patterned semiconductor layer formed on the first dielectric layer to overlap with the respective lower electrodes; (e) transparent upper electrodes formed on the semiconductor layer to overlap with the respective lower electrodes; (f) a second dielectric layer formed to cover the upper electrodes, the semiconductor layer, and the lower electrodes; and (g) a patterned signal line layer formed on the second dielectric layer; the signal line layer being electrically connected in common to the respective upper electrodes at the overlap parts of the semiconductor layer by way of contact holes of the second dielectric layer. The patterned semiconductor layer has island-shaped pixel parts defining pixel areas of the sensor for receiving incident light through the upper electrodes, overlap parts overlapping with the signal line layer, and interconnection parts interconnecting the pixel parts with the overlap parts. The upper electrodes, the pixel parts, and the lower electrodes constitute photodiodes.

11 Claims, 12 Drawing Sheets

IMAGE SENSOR AND METHOD OF FABRICATING THE SAME

BACKGROUND OF THE INVENTION

1. Field of the Invention

The present invention relates to an image sensor and a method of fabricating the same and more particularly, to an image sensor comprising photoelectric converter elements formed on a transparent substrate, each of the elements having a photoelectric converting layer and lower and upper electrodes located at lower and upper sides of the layer, and a method of fabricating the sensor. The sensor is preferably used for facsimiles, image scanners, and so on.

2. Description of the Related Art

Image sensors are incorporated into various image sensing devices or apparatuses (e.g., facsimiles and image scanners) to detect or sense the light reflected by the surface of an object to be sensed such as a paper document. Image sensors of this type sense the image on an object linearly and thus, they have a typical structure that photodiodes serving as photoelectric converter elements and Thin-Film Transistors (TFTs) serving as switching elements are arranged along a straight line. An example of the typical structure is shown in FIGS. 1 to 4.

As shown in FIG. 1, a prior-art image sensor 100 comprises a signal line 110 extending along a specified direction (which is defined as the X direction here), photodiodes 112 arranged at regular intervals along the line 110 in the X direction, TFTs 113 arranged at regular intervals along the line 110 in the X direction. The line 110, the photodiodes 112 and the TFTs 113 are formed on a transparent substrate 101.

One end of the signal line 110 extends in a direction perpendicular to the X direction (which is defined as the Y direction here) to be connected to a pad 120 for connecting electrically the line 110 to an external circuit or device. The pad 120 is approximately square.

Each of the photodiodes 112 is formed in their pixel area 121 with an approximately square shape. As explained later, the pixel areas 121 are defined by a patterned amorphous silicon (a-Si) layer that forms the photodiodes 112. Each of the TFTs 113 is located near the corresponding photodiode 112.

Each of the pixel areas 121, an adjoining, corresponding one of the photodiodes 112, and an adjoining, corresponding one of the TFTs 113 form the pixel of the sensor 100. Thus, it is said that the sensor 100 comprises the pixels aligned regularly in the X direction. Since all the pixels have the same structure, the structure of one pixel is explained below for simplification.

FIGS. 2 to 4 are cross-sectional views along the lines II—II, III—III, and IV—IV in FIG. 1, respectively, which show the detailed pixel structure of the prior-art sensor 100.

As shown in FIG. 4, a patterned semiconductor layer 130 is formed on the upper surface of the transparent substrate 101. The layer 130 is approximately rectangular in plan shape. The layer 130 is selectively doped with impurity, forming a pair of source/drain regions 131a and 131b of the TFT 113. The undoped part of the layer 130 between the source/drain regions 131a and 131b forms a channel region 132. An electrically conductive channel of the TFT 113 is generated in the region 132 on operation.

A dielectric layer 102 is formed to cover the whole surface of the substrate 101. The layer 102 covers the semiconductor layer 130 also. The part of the layer 102 located on the channel region 132 serves as the gate dielectric of the TFT 113.

A gate electrode 133 is formed on the part of the dielectric layer 102 serving as the gate dielectric. The electrode 133 is located just over the channel region 132.

A first interlayer dielectric layer 104 is formed on the dielectric layer 102 to cover entirely the same. The layer 104 covers the gate electrode 133 as well.

As shown in FIG. 2, the lower electrode 105 of the photodiode is formed on the first interlayer dielectric layer 104. The electrode 105, which has an approximately square plan shape, includes a connection part 105a that is used for electrical connection to the source/drain region 131b. The connection part 105a is formed to be approximately rectangular and to extend to the region 131b.

An amorphous silicon (a-Si) layer 106 with an approximately square plan shape is formed on the lower electrode 105 of the photodiode 112. This a-Si layer 106 defines the pixel area 121 of the sensor 100.

A transparent, upper electrode of the photodiode 112, which has an approximately square plan shape, is formed on the a-Si first interlayer dielectric layer 104 to cover entirely the underlying a-Si layer 106. The upper electrode 107 includes a connection part 107a that is used for electrical connection to the signal line 110. The connection part 107a is formed to be approximately rectangular. The part 107a extends to be overlapped with the line 110.

As shown in FIGS. 2 and 3, a patterned barrier metal layer 108 is formed on the connection part 107a of the upper electrode 107. The layer 108 serves to prevent the substance contained in the signal line 110 from diffusing into the upper electrode 107.

A second interlayer dielectric layer 109 is formed on the first interlayer dielectric layer 104, covering the lower electrode 105, the upper electrode 107, and the barrier metal layer 108.

As shown in FIGS. 2 to 4, the signal line 110 and two wiring lines 134 and 135 are formed on the second interlayer dielectric layer 109. The signal line 110 overlaps with the underlying connection part 107a of the upper electrode 107 and the underlying barrier metal layer 108. The line 110 is contacted with the layer 108 and electrically connected to the same (and the electrode 107) by way of contact holes 118 of the dielectric layer 109.

One end of the wiring line 134 is contacted with the underling connection part 105a of the lower electrode 105 of the photodiode 112 and electrically connected to the same by way of contact holes 136 of the second interlayer dielectric layer 109. The other end of the line 134 is contacted with the underling source/drain region 131b and electrically connected to the same by way of contact holes 137 that penetrate the underlying dielectric layer 102 and the first and second interlayer dielectric layers 104 and 109. Thus, the wiring line 134 interconnects the lower electrodes 105 with the source/drain region 131b of the TFT 113.

One end of the line 135 is contacted with the underling source/drain region 131a and electrically connected to the same by way of contact holes 138 that penetrate the underlying dielectric layer 102 and the first and second interlayer dielectric layers 104 and 109.

The combination of the pair of source/rain regions 131a and 131b, the channel region 132, the dielectric layer 102, and the gate electrode 133 constitutes the TFT 113. The combination of the lower electrode 105, the a-Si layer 106 and the upper electrode 107 constitute the photodiode 112 and its capacitor (not shown) for storing the electrical charge to be generated in the photodiode 112.

Next, the operation of the prior-art image sensor 100 is explained below.

When incident light enters the photodiodes 112, electrical charges are generated in the photodiodes 112 and stored temporarily in their capacitors. The charges thus stored in the capacitors are sequentially read out and outputted as electrical signals by sequentially driving the TFTs 113 serving as the switching elements. The driving operation of the TFTs 113 are typically carried out at a rate of several hundreds kilohertz (kHz) or several hundreds megahertz (MHz).

The prior-art image sensor 100 is fabricated in the following way.

First, a polysilicon layer (not shown) is formed on the upper surface of the transparent substrate 101. The substrate 101 is made of transparent glass for incident light, for example. The polysilicon layer is patterned to have a predetermined shape, forming the patterned semiconductor layer 130 for the TFTs 113 on the substrate 101. Silicon dioxide ($SiO_2$) is deposited on the substrate 101 to entirely cover its surface and the semiconductor layer 130, forming the dielectric layer 102 on the substrate 101. The gate electrode 133 is selectively formed on the dielectric layer 102 to be overlapped with the semiconductor layer 130. Following this, specific impurity is selectively doped into the semiconductor layer 130, forming the pair of source/drain regions 131a and 131a therein. The undoped part of the layer 130 forms the channel region 132.

Subsequently, $SiO_2$ is deposited to cover the entire surface of the substrate 101, forming the first interlayer dielectric layer 104 that covers the whole substrate 101. A metal layer (not shown) is formed on the dielectric layer 104 and is patterned to have a predetermined plan shape, forming the lower electrode 105 including the connection part 105a. For example, the metal layer is made of chromium (Cr).

An a-Si layer (not shown) with a thickness of approximately 1 μm is formed on the first interlayer dielectric layer 104 and then, it is patterned to have a predetermined plan shape, forming the patterned a-Si layer 106. Through this patterning process, the layer 106 is divided into islands. These islands of the layer 106 define the square pixel areas 121, as shown in FIG. 1. The four sides of each area 121 are approximately 50 to 100 μm.

A transparent, electrically conductive layer (not shown) is formed on the first interlayer dielectric layer 104 to cover the whole a-Si layer 106. For example, the electrically conductive layer is made of Indium Tin Oxide (ITO). The electrically conductive layer thus formed is patterned to have a predetermined shape, forming the transparent, upper electrodes 107 of the photodiodes 112 along with their connection parts 107a. The electrode 107 is located to cover the step (i.e., the height or level difference) between the layers 104 and 106.

The barrier metal layer 108 is selectively formed on the connection part 107a of the upper electrode 107. The layer 108 is located only in the overlapping area of the part 107a with the overlying signal line 110.

Furthermore, dielectric such as silicon nitride ($Si_3N_4$) is deposited on the first interlayer dielectric layer 104 to cover the whole surface of the substrate 101, forming the second interlayer dielectric layer 109. The layer 109 is selectively removed to form the contact holes 118 exposing the barrier metal layer 108 and the contact holes 136 exposing the connection part 105a of the lower electrode 105. At the same time as this, the second and first interlayer dielectric layers 109 and 104 are selectively removed to form the contact holes 137 and 138 exposing respectively the source/drain regions 131a and 131b.

A metal layer (not shown) is formed on the second interlayer dielectric layer 109 so as to fill the contact holes 118, 136, 137, and 138. The metal layer thus formed is patterned to have a predetermined shape, forming the signal line 110 and the wiring lines 134 and 135 on the layer 109. The metal layer is made of aluminum (Al), for example.

Through the above-described process steps, the prior-art image sensor 100 shown in FIG. 1 is fabricated.

With the prior-art image sensor 100, the photodiode 112 has a layered structure of the lower electrode 105, the a-Si layer 106, and the transparent, upper electrode 107 and at the same time, the upper electrode 107 is formed to cover (or extend through) the step (i.e., the height or level difference) between the first interlayer dielectric layer 104 and the a-Si 106 in order to be electrically connected with the overlying signal line 110. Thus, as shown by the arrow A in FIG. 2, there is a problem that the upper electrode 107 tends to be disconnected or broken near the top edges of the layer 106.

To prevent the break or disconnection of the electrode 107, the thickness of the a-Si layer 106 may be decreased. In this case, however, there arises another problem that the optical absorption rate of the layer 106 tends to lower thereby degrading the sensitivity of the sensor 100 itself.

On the other hand, the Japanese Non-Examined Patent Publication No. 62-204570 published in 1987 discloses an "amorphous silicon (a-Si) image sensor", in which the lower electrodes are arranged at intervals on the substrate while a dielectric is formed to fill the recesses or gaps formed between the electrodes. This Publication discloses another structure that the substrate has recesses on its surface and the lower electrodes are formed to be buried in the recesses. Furthermore, it discloses a further structure that a dielectric layer with recesses is formed on the substrate and the lower electrodes are formed to be buried in the recesses.

If any of the structures disclosed in the Publication No. 62-204570 is adopted to the prior-art image sensor 100 described above, no step or height difference occurs in the vicinity of the lower electrode 105 and therefore, the surface of the a-Si layer 106 can be substantially flattened. This is effective for the case where the a-Si layer 106 is not divided into the island to define the pixel areas 121, in other words, the layer 106 is patterned to be linear along the alignment direction of the pixel areas 121.

However, none of the structures disclosed in the Publication No. 62-204570 is able to solve the above-described problem that the upper electrode 107 tends to be broken or disconnected. As already described previously, the break or disconnection of the electrode 107 is caused by the step or height-difference between the a-Si layer 106 and the electrode 107, which is independent of the existence or absence of the lower electrode 105. As a result, the problem of break or disconnection of the electrode 107 is never solved by the use of any of the structures disclosed in the Publication No. 62-204570.

Additionally, with the prior-art image sensor 100 having the island-shaped a-Si layer 106, as shown in FIG. 1, even if some step or height-difference exists in the periphery of the electrode 105, it scarcely affects the operation of the sensor 100 itself.

Moreover, it is typical that the lower electrode 105 has a thickness of approximately 100 nm while the a-Si layer 106 needs to be as thick as approximately 1 μm for sufficient absorption of the incident light. Thus, the step or height-difference in the periphery of the a-Si layer 106 tends to strongly affect the operation of the sensor 100.

SUMMARY OF THE INVENTION

Accordingly, an object of the present invention is to provide an image sensor that prevents effectively the break or disconnection of transparent electrodes of photodiodes and a method of fabricating the sensor.

Another object of the present invention is to provide an image sensor that enhances its sensitivity and a method of fabricating the sensor.

Still another object of the present invention is to provide an image sensor that suppresses effectively the smear in image and a method of fabricating the sensor.

The above objects together with others not specifically mentioned will become clear to those skilled in the art from the following description.

According to a first aspect of the present invention, an image sensor is provided, which is comprised of:

(a) a transparent substrate;

(b) a first dielectric layer formed over the substrate;

(c) lower electrodes arranged at intervals on the first dielectric layer;

(d) a patterned semiconductor layer formed on the first dielectric layer to overlap with the respective lower electrodes;

(e) transparent upper electrodes formed on the semiconductor layer to overlap with the respective lower electrodes;

(f) a second dielectric layer formed to cover the upper electrodes, the semiconductor layer, and the lower electrodes; and (g) a patterned signal line layer formed on the second dielectric layer;

the signal line layer being electrically connected in common to the respective upper electrodes at the overlap parts of the semiconductor layer by way of contact holes of the second dielectric layer;

wherein the patterned semiconductor layer has island-shaped pixel parts defining pixel areas of the sensor for receiving incident light through the upper electrodes, overlap parts overlapping with the signal line layer, and interconnection parts interconnecting each of the pixel parts with a corresponding one of the overlap parts;

and wherein each of the upper electrodes, a corresponding one of the pixel parts of the semiconductor layer, and a corresponding one of the lower electrodes constitute a photodiode.

With the image sensor according to the first aspect of the present invention, the lower electrodes are arranged at intervals on the first dielectric layer and the patterned semiconductor layer is formed on the first dielectric layer to overlap with the respective lower electrodes. The upper electrodes are formed on the semiconductor layer to overlap with the respective lower electrodes. The signal line layer is formed on the second dielectric layer that covers the upper electrodes, the semiconductor layer, and the lower electrodes. The signal line layer is electrically connected in common to the respective upper electrodes at the corresponding overlap parts of the semiconductor layer by way of contact holes of the second dielectric layer.

Moreover, the patterned semiconductor layer has the island-shaped pixel parts defining the pixel areas of the sensor for receiving the incident light, the overlap parts overlapping with the signal line layer, and the interconnection parts interconnecting each of the pixel parts with a corresponding one of the overlap parts. Each of the upper electrodes, the corresponding one of the pixel parts of the semiconductor layer, and the corresponding one of the lower electrodes constitute the photodiode.

Accordingly, the transparent upper electrodes are not to contact the top edges of the respective pixel parts of the underlying semiconductor layer, in other words, the upper electrodes extend toward the signal line layer without penetrating through the vicinity of the top edges of the pixel parts of the semiconductor layer. Thus, the break or disconnection of the transparent upper electrodes of the photodiodes can be effectively prevented.

Also, since the break or disconnection of the upper electrodes can be effectively prevented, the thickness of the semiconductor layer can be sufficiently large. This means that the sensitivity of the image sensor can be enhanced.

In a preferred embodiment of the sensor according to the first aspect, a patterned light-shielding layer is additionally formed between the semiconductor layer and the substrate. The light-shielding layer serves to prevent light having entered through the substrate from reaching the semiconductor layer. In this embodiment, there is an additional advantage that the smear in image due to the fact that the overlap and/or interconnection parts of the semiconductor layer absorb the light having entered through the substrate can be suppressed effectively.

In this embodiment, preferably, the light-shielding layer shields the light having entered through the substrate not to enter the interconnection parts and the overlap parts of the semiconductor layer. In other words, the light-shielding layer is formed to entirely overlap with (or entirely cover) the interconnection parts and the overlap parts of the semiconductor layer.

In this embodiment, it is preferred that the light-shielding layer is electrically connected in common to the upper electrodes. This is to prevent the combination of the light-shielding layer, the overlap and/or interconnection parts of the semiconductor layer, and the upper electrodes from operating as photodiodes.

In another preferred embodiment of the sensor according to the first aspect, a patterned light-shielding layer is additionally formed between the semiconductor layer and the substrate. The light-shielding layer serves to prevent an unwanted carrier generated in the interconnection parts of the semiconductor layer from diffusing into the pixel parts of the semiconductor layer. The unwanted carrier is generated by absorption of light having entered through the substrate in the interconnection parts of the semiconductor layer.

In this embodiment, preferably, the light-shielding layer has a width equal to sum of a diffusion length of the unwanted carrier and a width of an overlapping area of the light-shielding layer with the respective lower electrodes.

In this embodiment, it is preferred that the light-shielding layer is electrically connected in common to the upper electrodes. This is to prevent the combination of the light-shielding layer, the overlap and/or interconnection parts of the semiconductor layer, and the upper electrodes from operating as photodiodes.

In still another preferred embodiment of the sensor according to the first aspect, a first, patterned light-shielding layer is additionally formed between the semiconductor layer and the first interlayer dielectric layer and at the same time, a second, patterned light-shielding layer is additionally formed between the first interlayer dielectric layer and the substrate. The first light-shielding layer is apart from the respective lower electrodes by gaps. The second light-shielding layer is located to cover the gaps. The first and second light-shielding layers jointly serve to prevent light having entered through the substrate from reaching the overlap and interconnection parts of the semiconductor layer.

In this embodiment, preferably, the second light-shielding layer is located to overlap with the first light-shielding layer and the respective lower electrodes.

In this embodiment, it is preferred that the first and second light-shielding layers are electrically connected in common to the upper electrodes. This is to prevent the combination of the first and second light-shielding layers, the overlap and/or interconnection parts of the semiconductor layer, and the upper electrodes from operating as photodiodes.

According to a second aspect of the present invention, a method of fabricating an image sensor is provided. This method, which is applicable to fabrication of the image sensor according to the first aspect, comprises the steps of:

(a) forming a first dielectric layer over a transparent substrate;

(c) forming lower electrodes to be arranged at intervals on the first dielectric layer;

(d) forming a patterned semiconductor layer on the first dielectric layer to overlap with the respective lower electrodes;

(e) forming transparent upper electrodes on the semiconductor layer to overlap with the respective lower electrodes;

(f) forming a second dielectric layer to cover the upper electrodes, the semiconductor layer, and the lower electrodes; and (g) forming a patterned signal line layer on the second dielectric layer in such a way that the signal line layer is electrically connected in common to the respective upper electrodes at the overlap parts of the semiconductor layer by way of contact holes of the second dielectric layer;

wherein in the step (d), the patterned semiconductor layer is formed to have island-shaped pixel parts defining pixel areas of the sensor for receiving incident light through the upper electrodes, overlap parts overlapping with the signal line layer, and interconnection parts interconnecting each of the pixel parts with a corresponding one of the overlap parts;

and wherein each of the upper electrodes, a corresponding one of the pixel parts of the semiconductor layer, and a corresponding one of the lower electrodes constitute a photodiode.

With the method of fabricating an image sensor according to the second aspect of the present invention, because of substantially the same reason as the sensor according to the first aspect, the same advantages as those in the sensor according to the first aspect are given.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
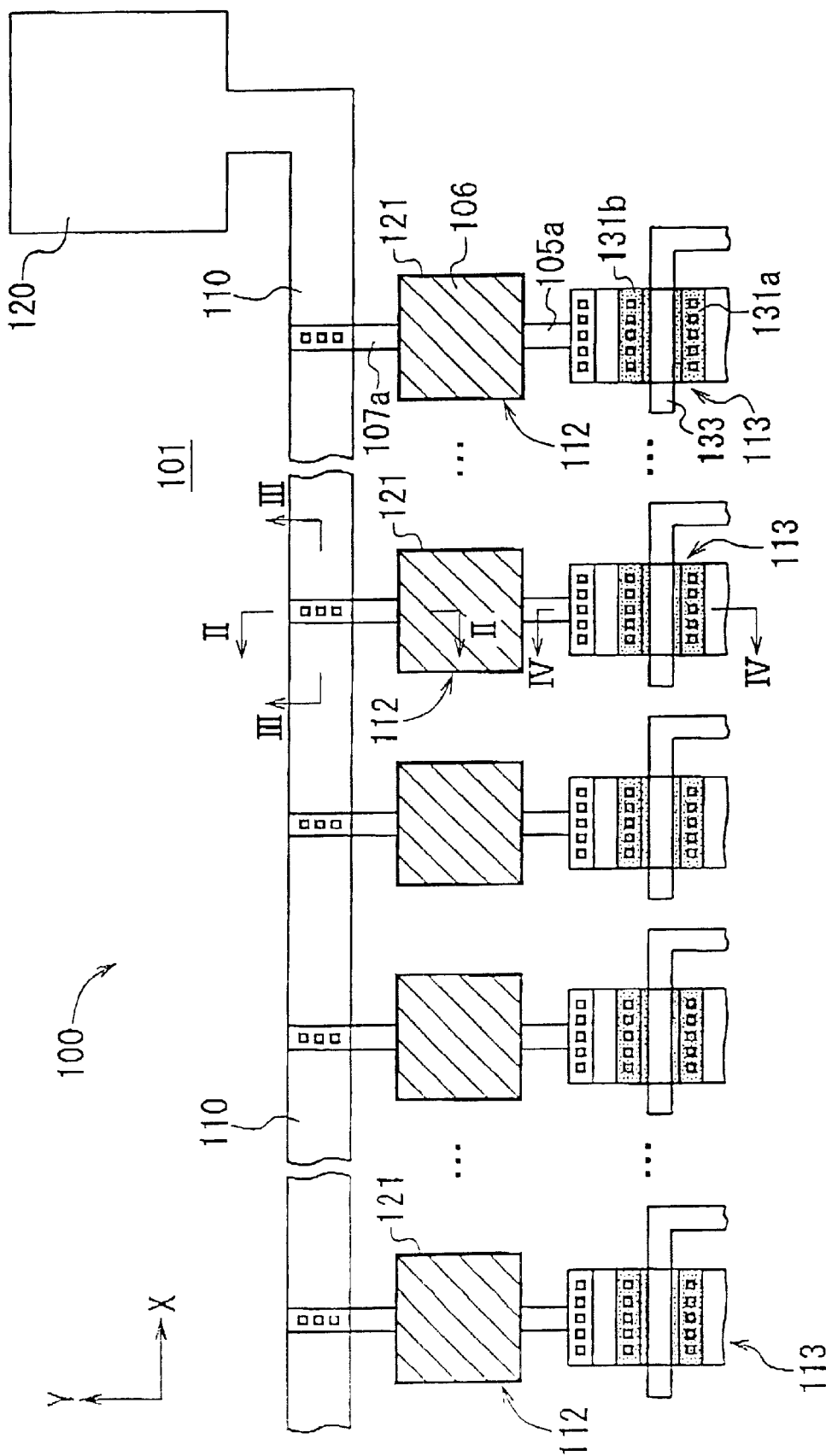
FIG. 1 is a schematic, partial plan view showing the configuration of a prior-art image sensor.
Figure 2:
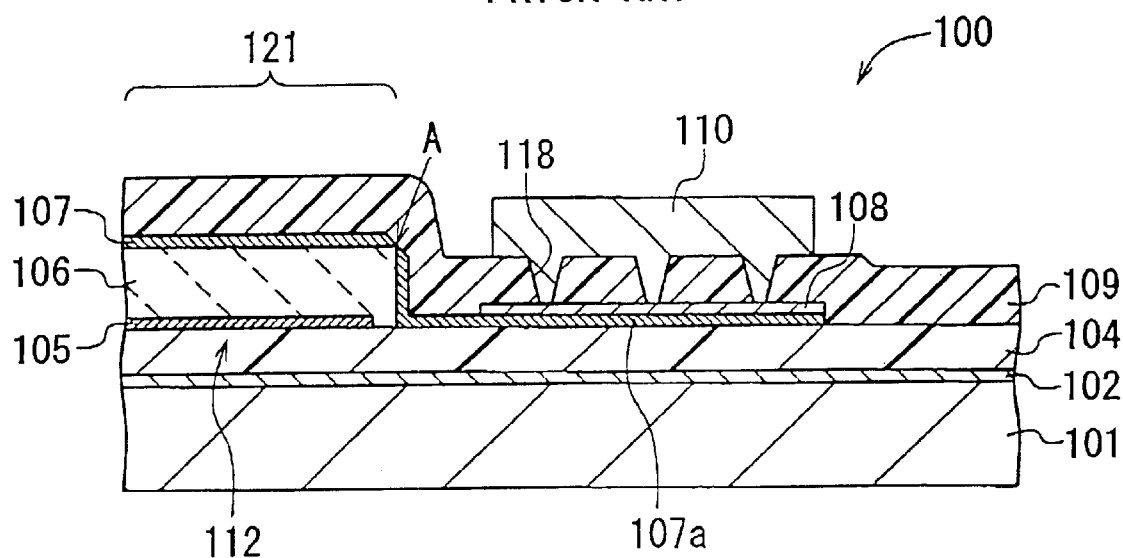
FIG. 2 is a cross-sectional view along the line II—II in FIG. 1.
Figure 3:
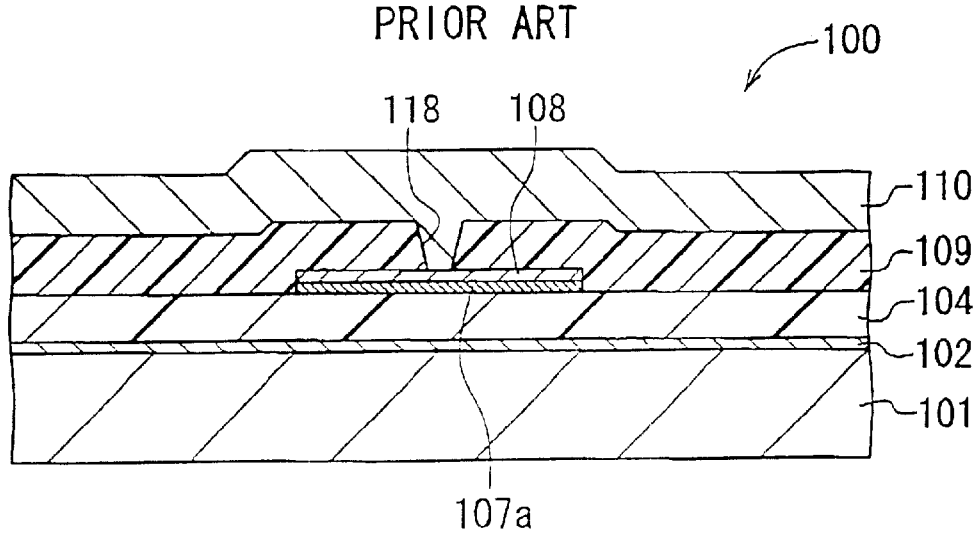
FIG. 3 is a cross-sectional view along the line III—III in FIG. 1.
Figure 4:
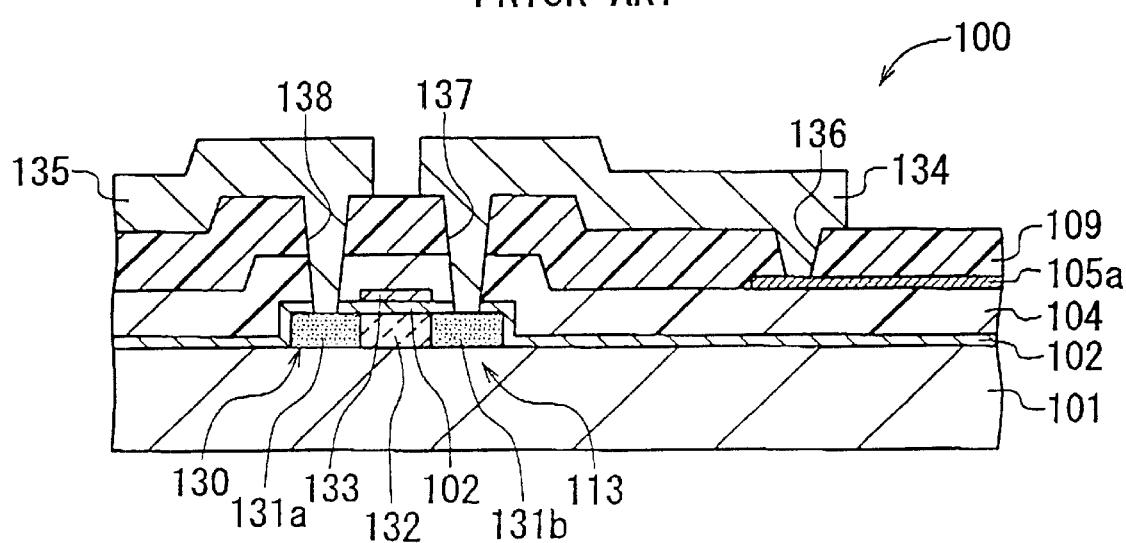
FIG. 4 is a cross-sectional view along the line IV—IV in FIG. 1.

Preferred embodiments of the present invention will be described in detail below while referring to the drawings attached.

FIRST EMBODIMENT

An image sensor 40 according to a first embodiment of the invention has a configuration as shown in FIGS. 5 to 9.

Figure 5:
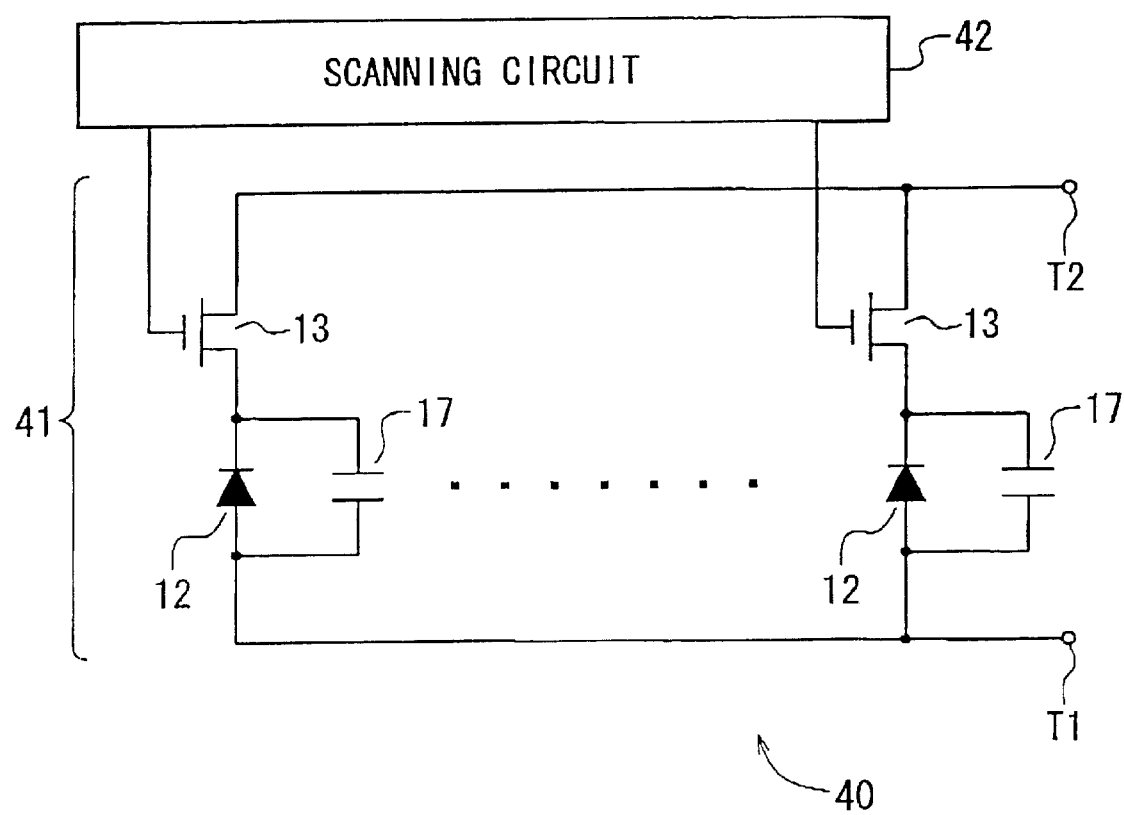
FIG. 5 is a circuit diagram showing the circuit configuration of an image sensor according to a first embodiment of the invention.

As shown in FIG. 5, the image sensor 40 includes a light sensing section 41 and a scanning circuit 42 for driving the sensing section 41.

The sensing section 41 comprises photodiodes 12 serving as photoelectric converter elements, storage capacitors 17 for temporarily storing the electrical charges generated by incident light in the corresponding photodiodes 12, and TFTs 12 serving as switching elements.

The photodiodes 12 are connected in parallel to the respective storage capacitors 17. One end of each photodiode 12 is connected to the drain of a corresponding one of the TFTs 12 while the other end is connected to a terminal T1. The terminal T1 is used as an output terminal of the sensing section 41.

The sources of the TFTs 13 are connected in common to a terminal T2. The gates of the TFTs 13 are connected to the respective terminals (not shown) of the scanning circuit 42. The terminal T2 is used as a ground terminal of the sensing section 41.

Figure 6:
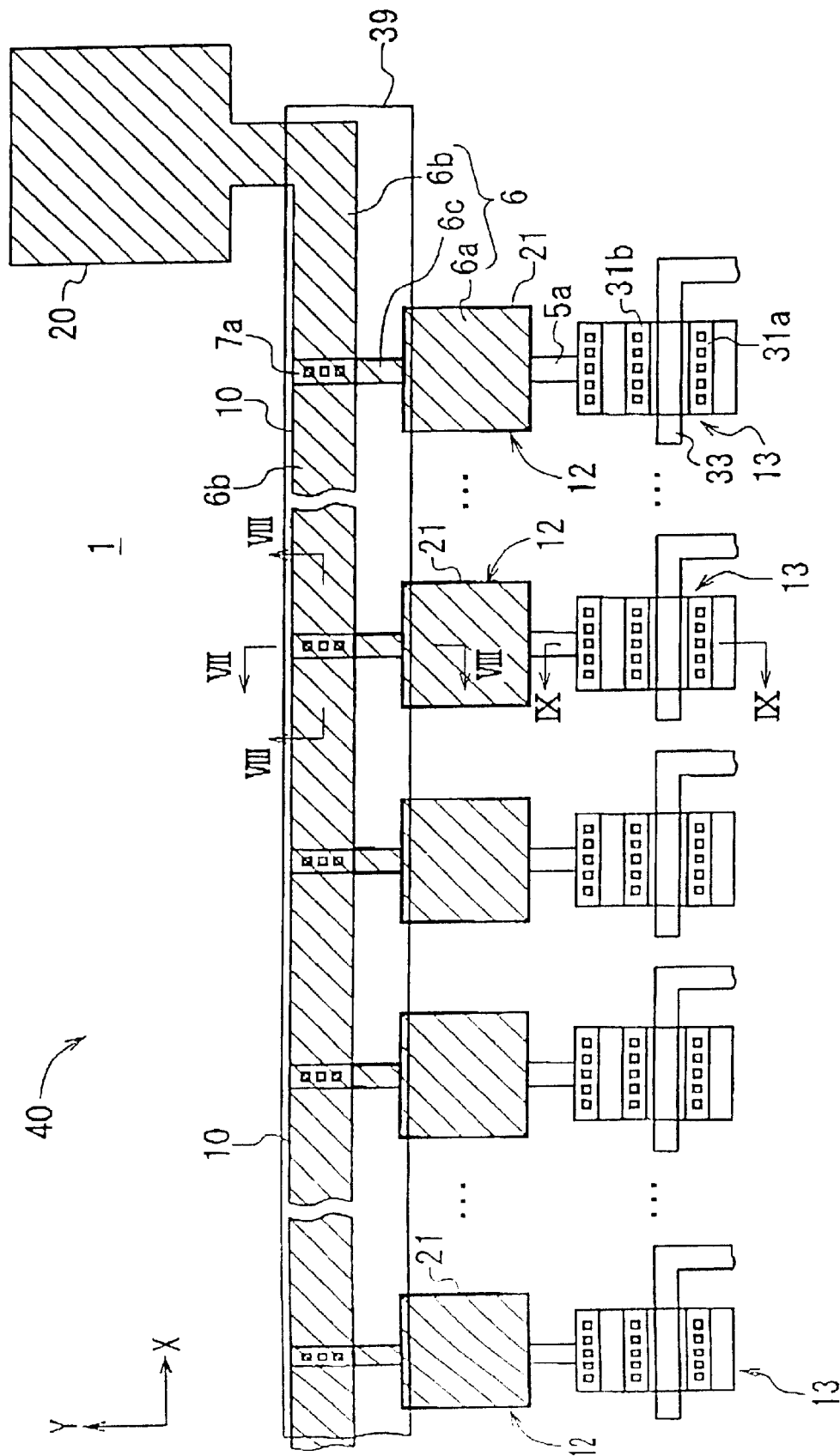
FIG. 6 is a schematic, partial plan view showing the configuration of the image sensor according to the first embodiment of FIG. 5.

FIG. 6 shows the concrete configuration of the sensing section 41 of the sensor 40.

As seen from FIG. 6, the sensor 40 comprises a signal line 10 extending along a specified direction (which is defined as the X direction here), the photodiodes 12 arranged at regular intervals in the X direction in the vicinity of the line 10, the TFTs 13 arranged at regular intervals in the X direction in the vicinity of the photodiodes 12. The line 10, the photodiodes 12 and the TFTs 13 are formed on a transparent substrate 1.

One end of the line 10 extends in a direction perpendicular to the X direction (which is defined as the Y direction here) to be connected to a pad 20 for connecting electrically the line 10 to an external circuit or device. The pad 20 is approximately square. The pad 20 serves as the output terminal T1 shown in FIG. 5.

Each of the photodiodes 12 is formed in a corresponding pixel area 21 with an approximately square shape. As explained later, the pixel areas 21 are defined by a patterned amorphous silicon (a-Si) layer (i.e., islands of the a-Si layer) used for the photodiodes 12. Each of the TFTs 13 is located near a corresponding one of the photodiodes 12.

Each of the pixel areas 21, an adjoining, corresponding one of the photodiodes 12, and an adjoining, corresponding one of the TFTs 13 constitute the pixel of the sensor 40. Thus, it is said that the sensor 40 comprises the pixels aligned regularly in the X direction. Since all the pixels have the same structure, the structure of the single pixel is explained below for the sake of simplification.

Figure 7:
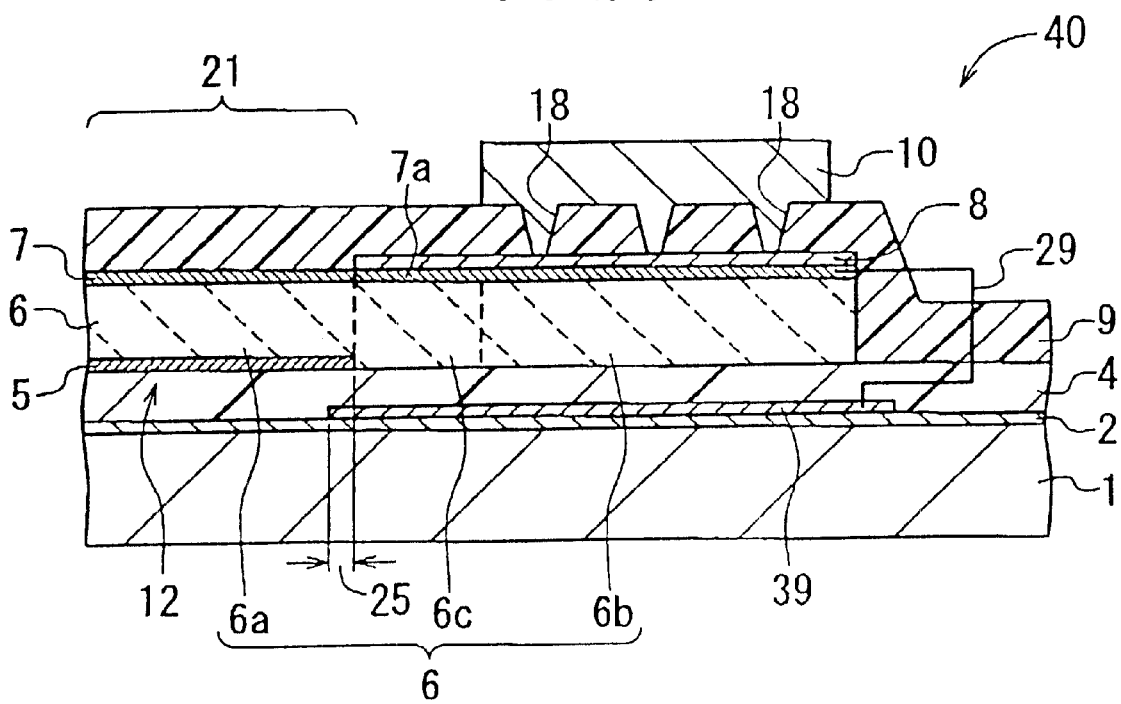
FIG. 7 is a cross-sectional view along the line VII—VII in FIG. 6.
Figure 8:
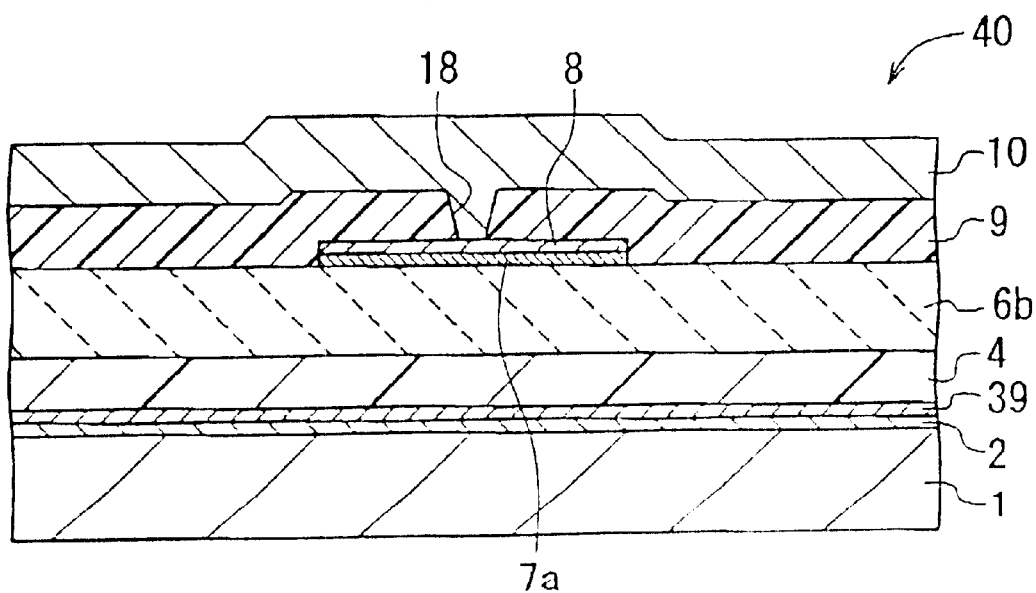
FIG. 8 is a cross-sectional view along the line VIII—VIII in FIG. 6.
Figure 9:
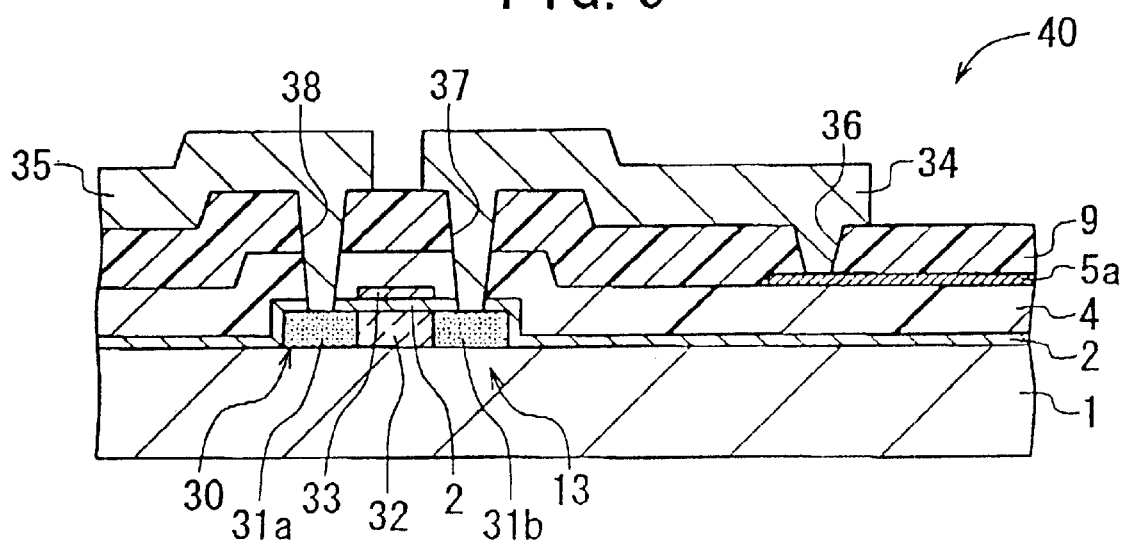
FIG. 9 is a cross-sectional view along the line IX—IX in FIG. 6.

FIGS. 7 to 9 are cross-sectional views along the lines VII—VII, VIII—VIII, and IX—IX in FIG. 6, respectively, which show the detailed structure of the pixel of the sensor 40.

As shown in FIG. 9, a patterned semiconductor layer 30 is formed on the upper surface of the transparent substrate 1, which is used for the TFT 13. A polysilicon layer is typically used for the layer 30. The layer 30 has an approximately rectangular plan shape. The layer 30 is selectively doped with proper impurity, forming a pair of source/drain regions 31a and 31b of the TFT 13 therein. The undoped part of the layer 30 forms a channel region 32 between the source/drain regions 31a and 31b. A conductive channel of the TFT 13 is generated in the region 32 on operation.

A dielectric layer 2 is formed to cover the whole surface of the substrate 1. The layer 2 covers the semiconductor layer 30 also. The part of the layer 2 located on the channel region 32 serves as a gate dielectric of the TFT 13.

A gate electrode 33 is formed on the part of the dielectric layer 2. The electrode 33 is located just over the channel region 32.

Unlike the prior-art image sensor 100, a patterned light-shielding layer 39 is additionally formed on the dielectric layer 2. As clearly shown in FIG. 6, the layer 39 has an elongated shape (e.g., a strip-like shape) capable of shielding effectively the light entering the vicinity of the signal line 10 by way of the substrate 1. The layer 39 is located under the line 10 and extends in the X direction parallel to the signal line 10.

Preferably, the light-shielding layer 39 is made of the same material as the gate electrode 33. In this case, there is an additional advantage that the layer 39 and the electrode 33 can be formed in the same process step. Any electrically conductive material having a light-shielding property for the incident light of the sensor 40 may be used.

A first interlayer dielectric layer 4 is formed on the dielectric layer 2 to cover entirely the same. The layer 4 covers the gate electrode 33 formed on the layer 2 as well.

As shown in FIG. 7, a lower electrode 5 is formed on the first interlayer dielectric layer 4 so as to overlap partially with the underlying light-shielding layer 39, forming an overlapped area 25. The electrode 5 is made of an electrically conductive material having a light-shielding property for the incident light. The electrode 5, which has an approximately square plan shape, includes a connection part 5a which is used for electrical connection to the source/drain region 31b in the semiconductor layer 30. The connection part 5a is approximately rectangular and extends toward the source/drain region 31b.

As seen from FIGS. 6 and 7, a patterned a-Si layer 6 is formed on the lower electrode 5 and at the same time, it extends in the Y direction to overlap with the overlying signal line 10. The layer 6 is contacted with the first interlayer dielectric layer 4 outside the electrode 5.

The patterned a-Si layer 6 has first parts (i.e., a pixel parts) 6a that overlap approximately entirely with the respective lower electrode 5 and that define the respective pixel areas 21, a second part (i.e., an overlap part) 6b that overlaps with approximately entirely the overlying signal line 10, and third parts (i.e., interconnection parts) 6c that interconnects the first parts 6a with the second part 6b. Each first or pixel part 6a has an approximately square plan shape, which is the same as the pixel area 21. The second overlap part 6b extends along the signal line 10 and is commonly used for all the pixel areas 21. Each third or interconnection part 6c has an approximately rectangular plan shape whose width is about 10 to 20 μm. The first, second, and third parts 6a, 6b, and 6c are continuous in the Y direction and thus, the upper surface of the parts 6a, 6b, and 6c, which are positioned at the opposite side to the transparent substrate 1, is substantially flat. The pixel part 6a is contacted with the electrode 5 while the overlap and interconnection parts 6b and 6c are contacted with the first interlayer dielectric layer 4.

A transparent, upper electrode 7 with an approximately square plan shape is formed on the pixel part 6a of the a-Si layer 6, as shown in FIG. 7. The electrode 7 includes an additional connection part 7a that is used for electrical connection to the signal line 10. The connection part 7a is approximately rectangular and extends perpendicular to the signal line 10 to be overlap with the same, as shown in FIG. 6. The part 7a is located on the interconnection and overlap parts 6c and 6b of the a-Si layer 6. The part 7a has the same width as the interconnection part 6c.

As shown in FIGS. 7 and 8, a barrier metal layer 8 is formed on the connection part 7a of the upper electrode 7 to be entirely overlapped with the same. The layer 8 is used for improving the electrical and mechanical contact with the signal line 10. The layer 8 has a light-shielding function for shielding unwanted light entering the overlap and interconnection parts 6b and 6c of the a-Si layer 6.

A second interlayer dielectric layer 9 is formed on the first interlayer dielectric layer 4 to cover the lower electrode 5, the upper electrode 7, and the barrier metal layer 8.

As shown in FIGS. 7 to 9, the signal line 10 and two wiring lines 34 and 35 are formed on the second interlayer dielectric layer 9. The signal line 10 overlaps with the underlying connection part 7a of the upper electrode 7 and the underlying barrier metal layer 8. The line 10 is contacted with the metal layer 8 and electrically connected to the same (and the electrode 7) by way of contact holes 18 of the layer 8.

One end of the wiring line 34 is contacted with the underling connection part 5a of the lower electrode 5 and electrically connected to the same by way of contact holes 36 of the second interlayer dielectric layer 9. The other end of the line 34 is contacted with the underling source/drain region 31b and electrically connected to the same by way of contact holes 37 that penetrate the underlying dielectric layer 2 and the first and second interlayer dielectric layers 4 and 9.

One end of the line 35 is contacted with the underling source/drain region 31a and electrically connected to the same by way of contact holes 38 that penetrate the underlying dielectric layer 2 and the first and second interlayer dielectric layers 4 and 9.

The combination of the pair of source/rain regions 31a and 31b, the channel region 32, the dielectric layer 2, and the gate electrode 33 constitutes the TFT 13. The combination of the lower electrode 5, the first part 6a of the a-Si layer 6 and the upper electrode 7 constitute the photodiode 12 and the capacitor 17 for storing the electrical charge to be generated in the photodiode 12.

The lower surface of the first part 6a of the a-Si layer 6 forming the photodiode 12, which is located at the same side as the transparent substrate 1, is shielded by the lower electrode 5 having the light-shielding property. The lower surfaces of the overlap and interconnection parts 6b and 6c of the a-Si layer 6, which are located at the same side as the substrate 1, are shielded by the light-shielding layer 39. Due to the overlapping area 25 between the layer 39 and the electrode 5, the bypassing or diffracting incident light that will enter obliquely the a-Si layer 6 can be shielded as well.

The light-shielding layer 39 is electrically connected to the upper electrode 7 by way of a conductive line 29 (not shown). In this case, there is no possibility that the combination of the layer 39, the parts 6b and 6c of the a-Si layer 6, and the upper electrode 7 operates as a photodiode.

Next, a method of fabricating the image sensor 40 according to the first embodiment is explained below with reference to FIGS. 10A to 10C and FIGS. 11A to 11C.

First, a polysilicon layer (not shown) with a thickness of about 50 to 100 nm is formed on the surface of the transparent substrate 1 by a known method such as a Chemical Vapor Deposition (CVD) method. The substrate 1 is made of glass, for example. The polysilicon layer is patterned to have a predetermined shape by a known lithographic method, forming the patterned semiconductor layer 30 on the substrate 1. Then, a proper dielectric such as $SiO_2$ is deposited on the substrate 1 to entirely cover its surface and the semiconductor layer 30, forming the dielectric layer 2 on the substrate 1.

Next, on the dielectric layer 2, an electrically conductive layer (not shown) with a thickness of approximately 100 to 300 nm is formed. The electrically conductive layer is patterned to have a predetermined shape by a known lithographic method, forming the gate electrodes 33 and the light-shielding layer 39 on the layer 2. The layer 39 has an approximately rectangular shape that covers entirely the lower surfaces of the overlap and interconnection parts 6a and 6b of the a-Si layer 6 to be formed in a subsequent process step.

For example, the electrically conductive layer for the gate electrodes 33 and the light-shielding layer 39 is made of electrically conductive metal having a light-shielding property (e.g., tungsten (W) alloy). Alternately, this electrically conductive layer is made of the combination (i.e., the layered structure) of an electrically conductive metal sublayer having a light-shielding property and a polysilicon sublayer.

Figure 10A:
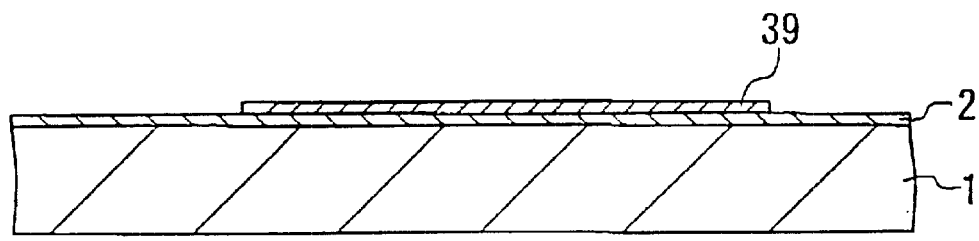
FIGS. 10A to 10C are schematic, partial cross-sectional views along the line VII—VII in FIG. 6, respectively, showing a method of fabricating the image sensor according to the first embodiment of FIG. 5.
Figure 11A:
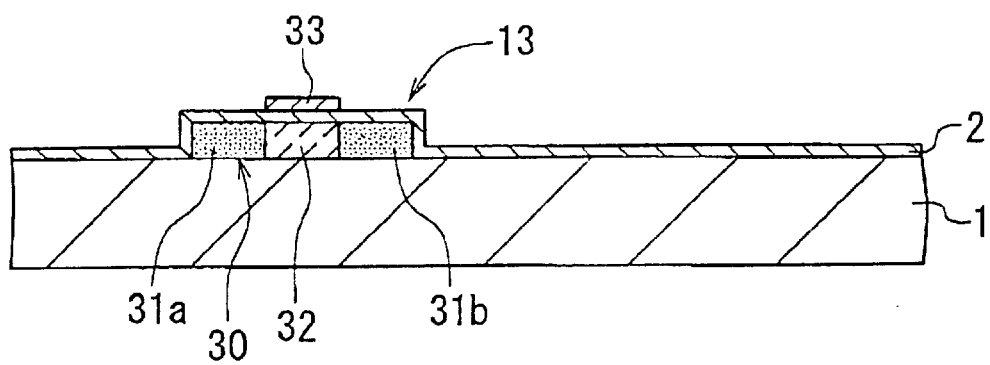
FIGS. 11A to 11C are schematic, partial cross-sectional views along the line IX—IX in FIG. 6, respectively, showing the method of fabricating the image sensor according to the first embodiment of FIG. 5.

Subsequently, proper impurity such as phosphorus (P) and boron (B) is selectively doped into the semiconductor layer 30 by an ion implantation method, forming the source/drain regions 31a and 31b. In this ion-implantation process, the gate electrodes 33 are used as a mask. The undoped regions of the layer 30 form the channel regions 32. The state at this stage is shown in FIGS. 10A and 11A.

A proper dielectric (not shown) such as $SiO_2$ is deposited to cover the whole surface of the substrate 1 by a known method such as CVD, forming the first interlayer dielectric layer 4. The layer 4 has a thickness of about 200 to 500 nm.

Following this, a proper metal (not shown) such as Cr with a thickness of about 100 nm is formed on the first interlayer dielectric layer 4. The metal layer is patterned to a predetermined shape by a known photolithographic method, forming the lower electrodes 5 having the connection parts 5a. At this time, the electrodes 5 are formed to be partially overlapped with the underlying light-shielding layer 39.

Figure 10B:
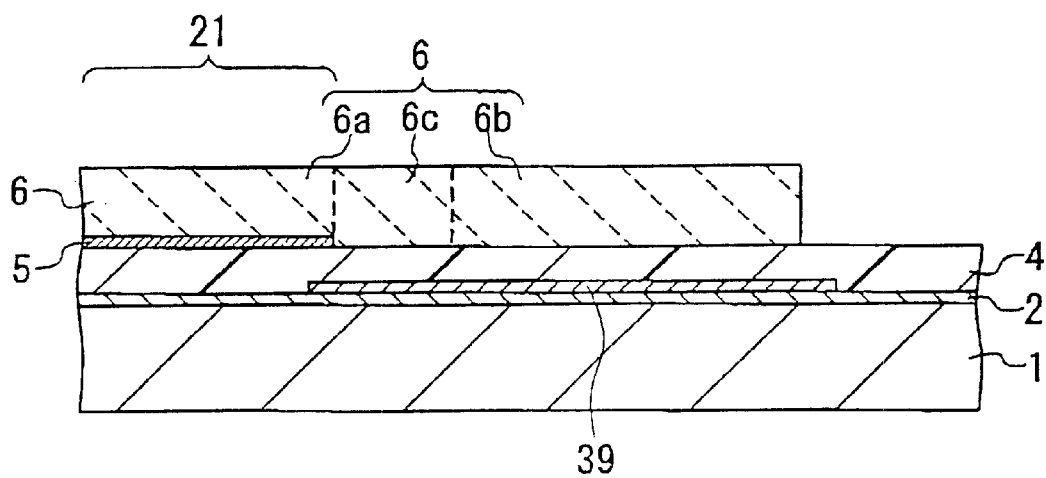
Figure 11B:
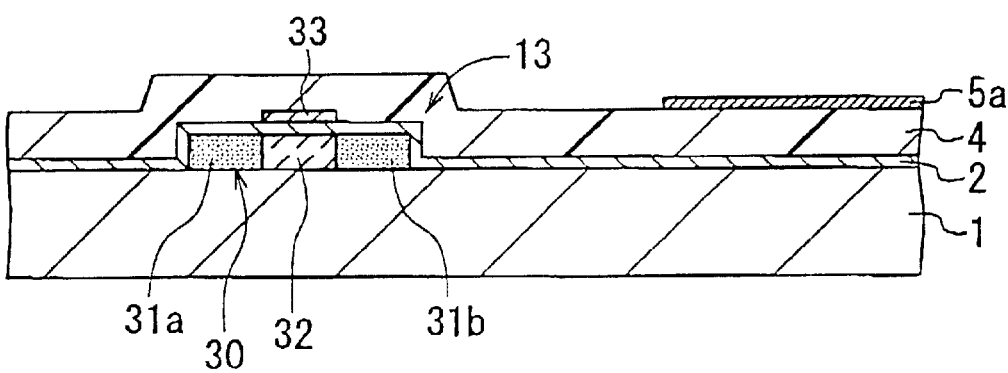

The a-Si layer 6 with a thickness of about 1 $\mu$is formed on the first interlayer dielectric layer 4 by a known method such as CVD. The layer 6 is then patterned to have a predetermined shape so as to form the first parts 6a on the lower electrodes 5 and the second and third parts 6b and 6c over the light-shielding layer 39. At this time, the first parts 6a are entirely overlapped with the respective electrodes 5. The second part 6b has approximately the same plan shape of the signal line 10. The state at this stage is shown in FIGS. 10B and 11B.

A transparent, electrically conductive layer (not shown) such as an ITO layer having a thickness of about 100 nm is formed on the first interlayer dielectric layer 4. The layer thus formed is patterned to form the transparent, upper electrodes 7 with the connection parts 7a.

A metal layer (not shown) such as a tungsten silicide ($WSi_2$) layer with a thickness of about 50 to 100 nm is formed on the first interlayer dielectric layer 4. The layer thus formed is patterned to form the barrier metal layer 8, which is located on the second and third parts 6b and 6c of the a-Si layer 6.

A proper dielectric such as $Si_3N_4$ is deposited on the first interlayer dielectric layer 4 by a known method such as CVD, forming the second interlayer dielectric layer 9 with a thickness of about 200 to 500 nm.

Figure 10C:
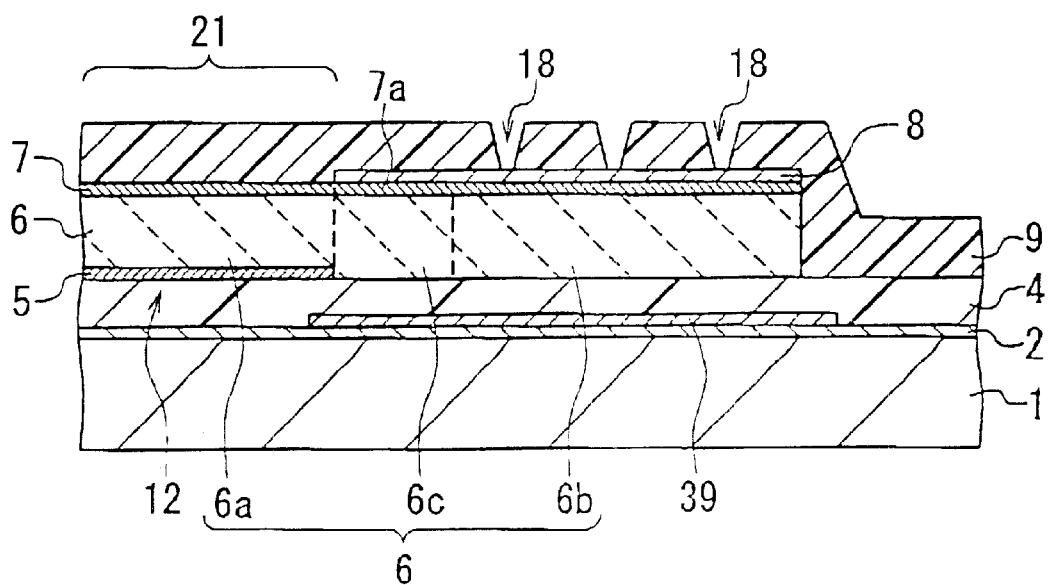
Figure 11C:
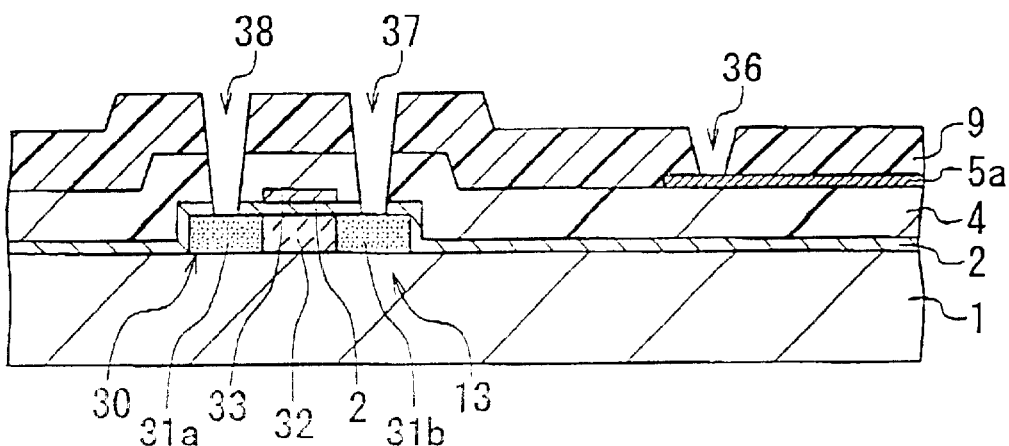

The second and first interlayer dielectric layers 9 and 4 and the dielectric layer 2 are selectively removed, forming the contact holes 18, 36, 37, and 38. The state at this stage is shown in FIGS. 10C and 11C.

Subsequently, a proper metal layer such as an Al layer with a thickness of about 500 to 1000 nm is formed on the second interlayer dielectric layer 9. The layer thus formed is patterned to form the signal line 10 and the wiring lines 34 and 35. The signal line 10 is formed to be approximately entirely overlapped with the underlying second or overlap part 6b of the a-Si layer 6.

Finally, a passivation layer (not shown) made of $Si_3N_4$ or polyimide is formed to cover the signal line 10 and the wiring lines 34 and 35 and the exposed areas of the underlying structure. Thus, the image sensor 40 according to the first embodiment is fabricated.

Next, the operation of the image sensor 40 a according to the first embodiment is explained below.

Figure 12:
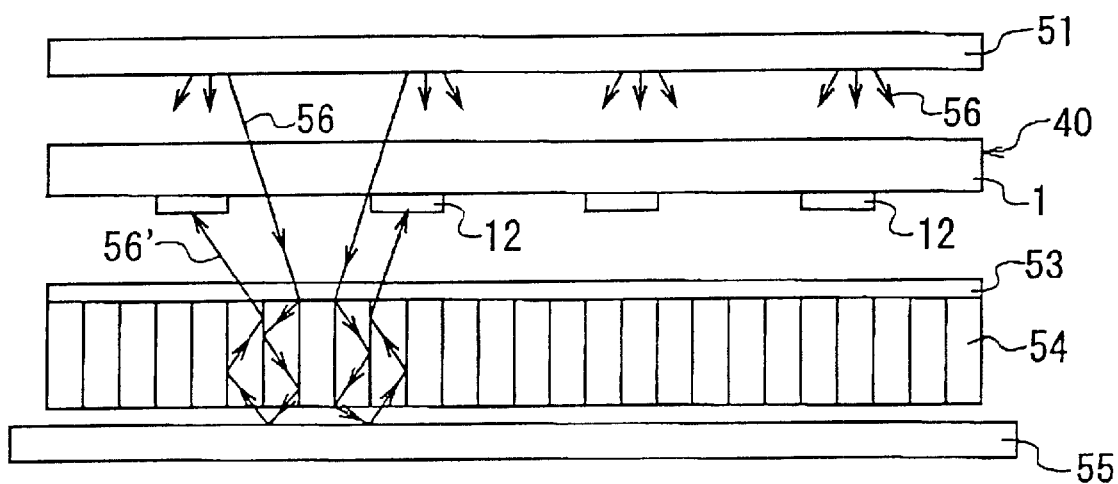
FIG. 12 is a schematic cross-sectional view showing an image scanner equipped with the image sensor according to the first embodiment of FIG. 5.

FIG. 12 shows an image scanner, which comprises the image sensor 40 according to the first embodiment, a light source 51, and a Fiber Array Plate (FAP) 54.

The sensor 40 is located between the light source 51 and the FAP 54 in such a way that the photodiode surface of the sensor 40 (i.e., the opposite surface of the sensor 40 to the substrate 1) is opposed to the FAP 54. The source 51, the sensor 40, and the FAP 55 are fixed at predetermined intervals. The surface of the FAP 54 is covered with an ITO layer 53. A document 55 as an image-sensing object is placed below the FAP 54 at a specific gap. The document 55 is typically a sheet of paper or plastic.

With the image scanner shown in FIG. 12, the light 56 emitted downward from the light source 51 enters the sensor 40 through the back or bottom surface of the transparent substrate 1. The light 56 that have entered the sensor 40 goes downward through the vicinity of the photodiodes 12 and the inside of the FAP 54. Thus, the light 56 is irradiated to the whole surface of the document 55 under the guiding operation of the FAP 54. The beams 56 thus irradiated to the document 55 is reflected by its surface, forming reflected light 56'. The reflected light 56' goes upward through the inside of the FAP 54 again toward the sensor 40, entering the photodiodes 12 of the sensor 40.

When the light 56' enters the photodiodes 12, the photodiodes 12 generate electrical charges due to absorption of the reflected light 56'. The charges thus generated are temporarily stored in the capacitors 17 for the photodiodes 12. The charges thus stored in the capacitors 17 are read out to the outside of the sensor 40 as an electrical signal by successively driving (i.e., turning on or off) the TFTs 13. This driving or reading operation is performed at a rate of several hundreds kHz or several hundreds MHz. Thus, the image on the surface of the document 55 is optically read out, forming an image in the sensor 40.

The size of the pixel areas 21 of the sensor 40 is determined or adjusted according to the size, the resolution, the optical system used in the scanner, and so on. For example, if the resolution is 200 dpi (dot per inch), the size of the pixel areas 21 is approximately 100 $\mu$m×100 $\mu$m. If the resolution is 400 dpi, the size of the pixel areas 21 is approximately 50 $\mu$m×50 $\mu$m.

As explained above, with the image sensor 40 according to the first embodiment, the a-Si layer 6 has the first, second, and third (pixel, overlap, and interconnection) parts 6a, 6b, and 6c, in which the first or pixel parts 6a are located in the respective pixel areas 21, the second or overlap part 6b is located under the signal line 10, and the third or interconnection parts 6c interconnect the pixel parts 6a with the overlap part 6b. Since these parts 6a, 6b, and 6c are continuous and their upper surfaces are substantially flat with no step, the whole upper surface of the a-Si layer 6 is approximately flat. Also, the transparent upper electrodes 7 including their connection parts 7a are arranged on the approximately flat surface of the a-Si layer 6.

Accordingly, the break or disconnection of the upper electrodes 7 is prevented from occurring and at the same time, the break or disconnection of the barrier metal layer 8 and the signal line 10 is avoided.

Since a low or small step is formed in the vicinity of the lower electrodes 5 with respect to the first interlayer dielectric layer 4, the step may affect badly the flatness of the a-Si layer 6. However, the electrodes 5 may be thin while the a-Si layer 6 needs to be sufficiently thick for accomplishing the desired optical absorption. Specifically, the electrodes 5 (approximately 100 nm) are sufficiently thinner than the a-Si layer 6 (approximately 1 $\mu$m). The thickness of the electrodes 5 is approximately one tenth (1/10) of the thickness of the layer 6. Thus, there arises almost no flatness degradation of the layer 6 due to the step of the electrodes 5. This means that no break or disconnection occurs in the upper electrodes 7.

Moreover, with the prior-art sensor 100 shown in FIG. 1, to minimize the step or level height formed in the vicinity of the a-Si layer 106 and to sufficiently absorb the light, the layer 106 is typically as thick as approximately 1 $\mu$m. On the other hand, with the sensor 40 according to the first embodiment, the a-Si layer 6 can be thicker than 1 $\mu$m because the break or disconnection of the transparent, upper electrodes 7 is surely prevented. In this case, the light absorption rate of the layer 6 (i.e., the first or pixel part 6a of the a-Si layer 6) is raised and therefore, the sensitivity of the sensor 40 can be enhanced.

Unlike the prior-art sensor 100, the sensor 40 according to the first embodiment has the light-shielding layer 39 under the signal line 10 in order to shield the incident light in the vicinity of the line 10. In other words, the light passing through the substrate 1 toward the second and third parts 6b and 6c of the a-Si layer 6 is surely shielded by the layer 39. Thus, there is an additional advantage that possible smear of the image generated by the sensor 40 is effectively suppressed or eliminated. This is due to the following reason.

If light enters the second and third parts 6b and 6c of the a-Si layer 6 by way of the substrate 1, the light generates unwanted carriers in the parts 6b and 6c. The unwanted carriers thus generated tend to laterally diffuse into the first part of the layer 6, causing some smear in the image and degrading the resolution of the sensor 40. Since the light-shielding layer 39 prevents the light from entering the parts 6b and 6c, this disadvantage can be eliminated.

The light-shielding layer 39 is formed to partially overlap with the underlying lower electrodes 5, forming the overlapping areas 25, when the line of sight is set to be parallel to the normal of the substrate 1. This is to prevent the incident light from entering the second and third parts 6b and 6c of the a-Si layer 6 by way of the gaps between the layer 39 and the electrodes 5. The size of the overlapping areas 25 may be easily optimized while taking the thickness of the first interlayer dielectric layer 4 and the entering direction of the light into consideration.

Also, it is effective that the width of the light-shielding layer 39 is adjusted while the diffraction or oblique entering of the light through the gaps between the layer 39 and the lower electrodes 5.

SECOND EMBODIMENT

Figure 13:
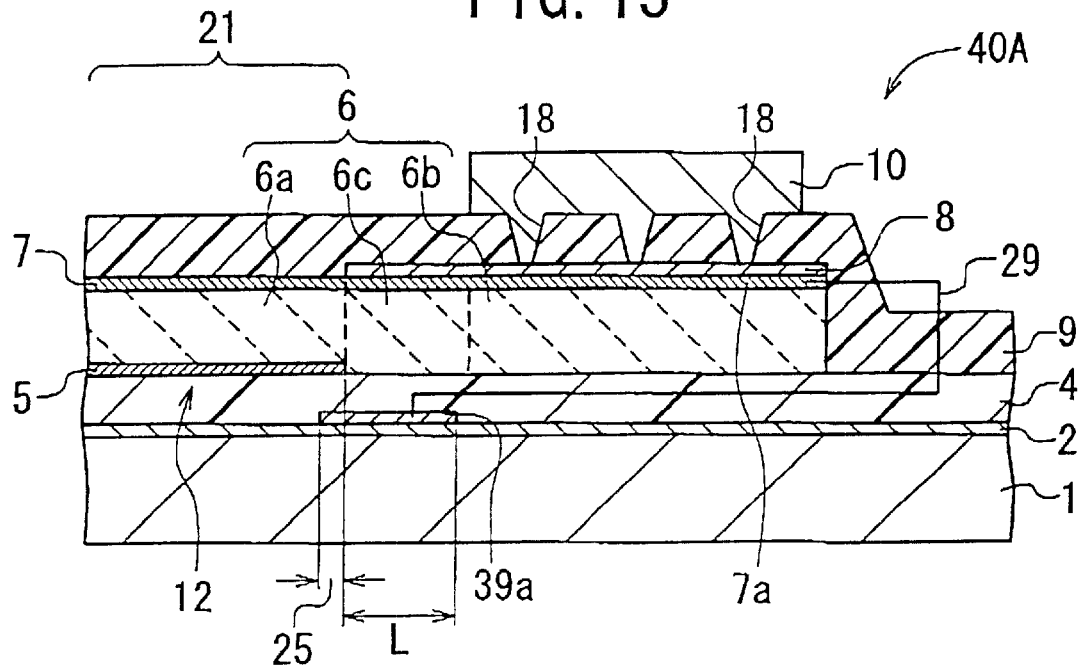
FIG. 13 is a schematic, partial cross-sectional view along the line VII—VII in FIG. 6, showing the configuration of an image sensor according to a second embodiment of the invention.

FIG. 13 shows an image sensor 40A according to a second embodiment of the invention, which has the same configuration as the sensor 40 according to the first embodiment except that a narrowed light-shielding layer 39a is provided instead of the light-shielding.layer 39. Therefore, the explanation on the same configuration is omitted here for simplification of description by attaching the same reference symbols as those in the sensor 40 to the same elements in FIG. 13.

With the sensor 40A according to the second embodiment, as shown in FIG. 13, the elongated light-shielding layer 39a, which extends along the signal line 10, has a much smaller width than the layer 39 in the first embodiment. The width of the layer 39a is determined in the following way.

As shown in FIG. 13, the length L, which is a lateral distance between the near edge of the pixel area 21 and the far edge of the layer 39a, is set to correspond to the diffusion length of a carrier (i.e., electron and/or hole). The sum of the length L and the width of the overlapping area 25 is equal to the width of the layer 39a. The reason that the length L is set to correspond to the diffusion length of the carrier is as follows.

It is supposed that the incident light enters the second and third parts 6a and 6b of the a-Si layer 6 by way of the substrate 1, thereby generating an unwanted carrier or carriers in the parts 6a and 6b. In this case, the unwanted carrier(s) tend(s) to diffuse laterally into the first part of the layer 6. However, these carriers do not reach a point apart from the point at which they have been generated by a distance longer than their diffusion length. From this point of view, the light-shielding layer 39a has a width greater than the diffusion length of the carrier(s) and thus, none of the unwanted carrier(s) reaches substantially the first part 6a of the layer 6. This means that it is sufficient for the layer 39a to cover only the area in which the unwanted carrier(s) generated therein reach the part 6a due to their lateral diffusion.

With the sensor 40A according to the second embodiment, there are the same advantage as those in the senor 40 according to the first embodiment.

THIRD EMBODIMENT

Figure 14:
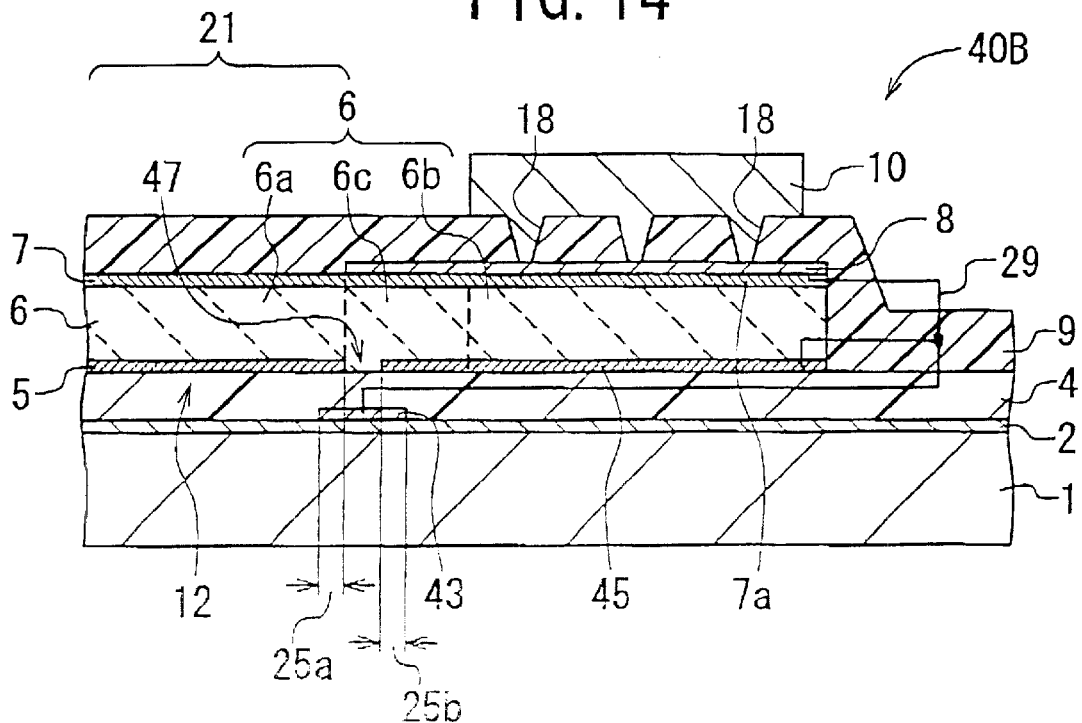
FIG. 14 is a schematic, partial cross-sectional view along the line VII—VII in FIG. 6, showing the configuration of an image sensor according to a third embodiment of the invention.

FIG. 14 shows an image sensor 40B according to a third embodiment of the invention, which has the same configuration as the sensor 40 according to the first embodiment except that first and second light-shielding layers 43 and 45 are provided instead of the light-shielding layer 39. Therefore, the explanation on the same configuration is omitted here for simplification of description by attaching the same reference symbols as those in the sensor 40 to the same elements in FIG. 14.

With the sensor 40B according to the third embodiment, as shown in FIG. 14, the first light-shielding layer 43 is formed on the dielectric layer 2 while the second light-shielding layer 45 is formed on the first interlayer dielectric layer 4. The layer 45 is adjacent to the lower electrode 5.

The second light-shielding layer 45 is located under the signal line 10 to shield the light propagating toward the line 10 and its vicinity by way of the substrate 1. The layer 45 extends along the line 10 (i.e., in the X direction). The layer 45, which is made of the same material as the lower electrodes 5, has an approximately rectangular shape. A gap 47 is formed between the layer 45 and the respective electrode 5, exposing the overlying a-Si layer 6. The layer 45 covers the whole lower surfaces of the second and third parts 6b and 6c o the layer 6 except for the area exposed through the gap 47.

The first light-shielding layer 43, which is located just below the gaps 47, has a width that covers selectively the area of the parts 6c exposed through the gaps 47. In other words, the layer 43 has a first overlapping area 25a that overlaps with the lower electrode 5 and a second overlapping area 25b that overlaps with the second light-shielding layer 45.

The first and second light-shielding layers 43 and 45 are provided due to the following two reasons.

The first reason is that the light is more difficult to obliquely enter the a-Si layer 6 by way of the substrate 1, because the second light-shielding layer 45 is formed in the same plane or level as the lower electrodes 5. The second reason is that the second light-shielding layer 45 can be formed in the same process step of forming the gate electrodes 33, if the layer 45 is made of the same material as the electrodes 33.

Preferably, the first and second light-shielding layers 43 and 45 are electrically connected to the upper electrode 7. In this case, the combination of the layers 43 and 45, the second and third parts 6b and 6c of the a-Si layer 6, and the upper electrode 7 does not operate as a photodiode.

Figure 15A:
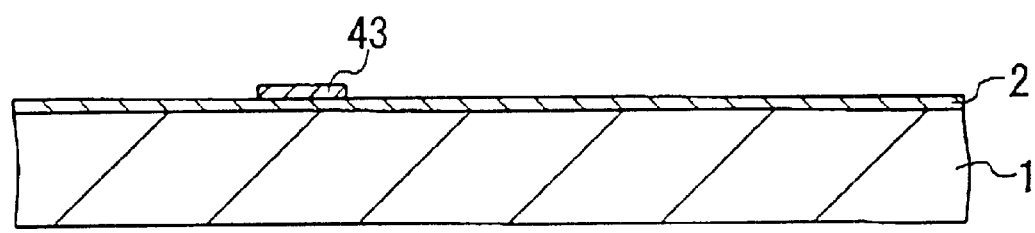
FIGS. 15A and 15B are schematic, partial cross-sectional views along the line VII—VII in FIG. 6, showing a method of fabricating the image sensor according to the third embodiment of FIG. 14, respectively.
Figure 15B:
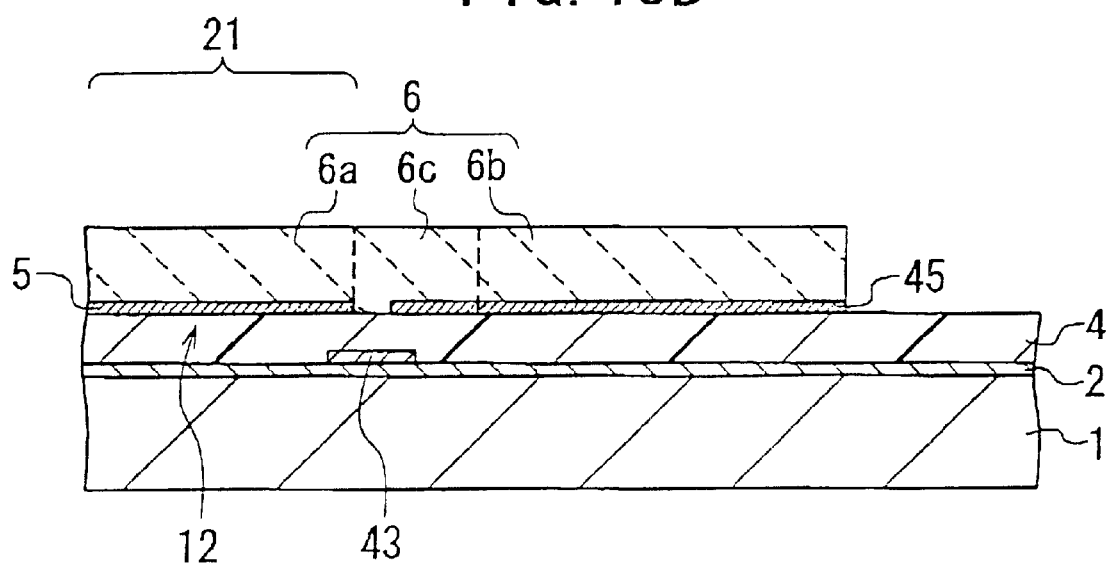

Next, a method of fabricating the image sensor 40B according to the third embodiment is explained below with reference to FIGS. 15A and 15B.

First, in the same way as those in the first embodiment, the semiconductor layer 30 for the TFTs 13 is formed on the transparent substrate 1 and then, the dielectric layer 2 is formed on the whole substrate 1.

Next, on the dielectric layer 2, an electrically conductive layer (not shown) with a thickness of approximately 100 to 300 nm is formed. The electrically conductive layer is patterned to have a predetermined shape by a known lithographic method, forming the gate electrodes 33 and the first light-shielding layer 43 on the layer 2, as shown in FIG. 15A. The layer 43 has a width that light-shields the gaps 47 between the second light-shielding layer 45 and the respective lower electrodes 5 shown in FIG. 13.

For example, the electrically conductive layer for the gate electrodes 33 and the first light-shielding layer 43 is made of electrically conductive metal having a light-shielding property such as a tungsten alloy. Alternately, this electrically conductive layer is made of the combination (i.e., the layered structure) of an electrically conductive metal sublayer having a light-shielding property and a polysilicon sublayer.

Subsequently, in the same way as in the first embodiment, proper impurity is selectively doped into the semiconductor layer 30, forming the source/drain regions 31a and 31b. The undoped regions of the layer 30 form the channel regions 32.

A proper dielectric (not shown) such as $SiO_2$ is deposited to cover the whole surface of the substrate 1 by a known method such as CVD, forming the first interlayer dielectric layer 4. The layer 4 has a thickness of about 200 to 500 nm.

Following this, a proper metal (not shown) such as Cr with a thickness of about 100 nm is formed on the first interlayer dielectric layer 4. The metal layer is patterned to a predetermined shape by a known photolithographic method, forming the lower electrodes 5 having the connection parts 5a and the second light-shielding layer 45. At this time, the electrodes 5 are formed to be partially overlapped with the underlying first light-shielding layer 43. The second light-shielding layer 45 is formed to have a rectangular shape with a width and a length that cover almost all the lower surfaces of the second and third parts 6b and 6c of the a-Si layer 6 The a-Si layer 6 with a thickness of about 1 $\mu$m is formed on the first interlayer dielectric layer 4 by a known method such as CVD. The layer 6 is then patterned to have a predetermined shape. The first parts 6a of the layer 6, which are approximately square, are located in the respective pixel areas 21. The second and third parts 6b and 6c of the layer 6 are located over the first light-shielding layer 43. At this time, the first parts 6a are entirely overlapped with the respective lower electrodes 5. The second parts 6b have approximately the same plan shape as the signal line 10 to be overlapped with the same. The state at this stage is shown in FIG. 15B.

Following this, the same process steps as used in the first embodiment are carried out. Specifically, a transparent, electrically conductive layer (not shown) is formed on the first interlayer dielectric layer 4 and is patterned to form the transparent, upper electrodes 7 with the connection parts 7a. A metal layer (not shown) is formed on the first interlayer dielectric layer 4 and is patterned to form the barrier metal layer 8, which is located on the second and third parts 6b and 6c of the a-Si layer 6. A proper dielectric such as $Si_3N_4$ is deposited on the first interlayer dielectric layer 4, forming the second interlayer dielectric layer 9. The second and first interlayer dielectric layers 9 and 4 and the dielectric layer 2 are selectively removed, forming the contact holes 18, 36, 37, and 38.

Subsequently, a proper metal layer such as an Al layer is formed on the second interlayer dielectric layer 9 and is patterned to form the signal line 10 and the wiring lines 34 and 35. The signal line 10 is formed to be approximately entirely overlapped with the underlying second parts 6b of the a-Si layer 6. Finally, a passivation layer (not shown) made of $Si_3N_4$ or polyimide is formed to cover the signal line 10 and the wiring lines 34 and 35 and the exposed areas of the underlying structure. Thus, the image sensor 40B according to the third embodiment is fabricated.

With the sensor 40B according to the third embodiment, there are the same advantage as those in the senor 40 according to the first embodiment.

VARIATIONS

With the above-described image sensors 40, 40A, and 40B according to the first, second, and third embodiments, the width of the third part 6c of the a-Si layer 6 is set as approximately 10 to 20 $\mu$m. This is to increase the light-transmission area by decreasing the occupation area of the part 6c. However, the width of the part 6c is not limited thereto and it may be changed optionally. For example, if the configuration is designed in such a way that the light enters the layer 6 by way of the gaps between the pixel areas 21, the width of the part 6c is unnecessary to be decreased. The width of the part 6c may be the same as the area 21.

Furthermore, with the above-described image sensor 40B according to the third embodiment, the second light-shielding layer 45 covers the whole lower surface of the second part 6b of the a-Si layer 6 except for the area exposed through the gap 47. However, like the sensor 40A according to the second embodiment, the layer 45 may be formed to cover only the area in which unwanted carriers generated therein reach the first part 6a of the layer 6 due to their lateral diffusion.

In the above-described first to third embodiments, the photodiodes serving as photoelectric converter elements are arranged along a straight line, because the sensors serve as a so-called line sensor. However, the invention is not limited thereto. The photoelectric converter elements may be arranged in any pattern. For example, they may be arranged along two or more straight lines or in a matrix array.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. An image sensor comprising:
    (a) a transparent substrate;
    (b) a first dielectric layer formed over the substrate;
    (c) lower electrodes arranged at intervals on the first dielectric layer;
    (d) a patterned semiconductor layer formed on the first dielectric layer to overlap with respective lower electrodes;
    (e) transparent upper electrodes formed on the semiconductor layer to overlap with the respective lower electrodes, the upper electrodes always being spaced apart from the first dielectric layer by the semiconductor layer;
    (f) a second dielectric layer formed to cover the upper electrodes, the semiconductor layer, and the lower electrodes; and
    (g) a patterned signal line layer formed on the second dielectric layer, the signal line layer being electrically connected in common to the respective upper electrodes at the overlap parts of the semiconductor layer by way of contact holed of the second dielectric layer;
    the patterned semiconductor layer having island-shaped pixel parts defining pixel areas of the sensor for receiving incident light through the upper electrodes, overlap parts overlapping with the signal line layer, and interconnection parts interconnecting each of the pixel parts with a corresponding one of the overlap parts;
    wherein each of the upper electrodes, a corresponding one of the pixel parts of the semiconductor layer, and a corresponding one of the lower electrodes constitute a photodiode.

2. The sensor according to claim 1, further comprising a patterned light-shielding layer formed between the semiconductor layer and the substrate;
    wherein the light-shielding layer serves to prevent light having entered through the substrate from reaching the semiconductor layer.

3. The sensor according to claim 2, wherein the light-shielding layer shields the light having entered through the substrate not to enter the interconnection parts and the overlap parts of the semiconductor layer.

4. The sensor according to claim 2, wherein the light-shielding layer is formed to entirely overlap with the interconnection parts and the overlap parts of the semiconductor layer.

5. The sensor according to claim 2, wherein the light-shielding layer is electrically connected in common to the upper electrodes.

6. The sensor according to claim 1, further comprising a patterned light-shielding layer formed between the semiconductor layer and the substrate;
    wherein the light-shielding layer serves to prevent an unwanted carrier generated in the interconnection parts of the semiconductor layer from diffusing into the pixel parts of the semiconductor layer, the unwanted carrier being generated by absorption of light having entered through the substrate in the interconnection parts of the semiconductor layer.

7. The sensor according to claim 6, wherein the light-shielding layer has a width equal to sum of a diffusion length of the unwanted carrier and a width of an overlapping area of the light-shielding layer with the respective lower electrodes.

8. The sensor according to claim 6, wherein the light-shielding layer is electrically connected in common to the upper electrodes.

9. The sensor according to claim 1, further comprising a first, patterned light-shielding layer formed between the semiconductor layer and the first interlayer dielectric layer and a second, patterned light-shielding layer formed between the first interlayer dielectric layer and the substrate;
    wherein the first light-shielding layer is apart from the respective lower electrodes by gaps, and the second light-shielding layer is located to cover the gaps;
    and wherein the first and second light-shielding layers jointly serve to prevent light having entered through the substrate from reaching the overlap and interconnection parts of the semiconductor layer.

10. The sensor according to claim 9, wherein the second light-shielding layer is located to overlap with the first light-shielding layer and the respective lower electrodes.

11. The sensor according to claim 9, wherein the first and second light-shielding layers are electrically connected in common to the upper electrodes.

* * * * *